(12) United States Patent
Igarashi et al.

(10) Patent No.: US 7,221,049 B2
(45) Date of Patent: May 22, 2007

(54) CIRCUIT DEVICE AND MANUFACTURING METHOD THEREOF

(75) Inventors: Yusuke Igarashi, Gunma (JP); Sadamichi Takakusaki, Gunma (JP); Hideki Mizuhara, Aichi (JP); Ryosuke Usui, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/139,263

(22) Filed: May 27, 2005

(65) Prior Publication Data

US 2005/0263880 A1 Dec. 1, 2005

(30) Foreign Application Priority Data

May 31, 2004 (JP) .......................... P. 2004-162654

(51) Int. Cl.
*H01I 23/12* (2006.01)
(52) U.S. Cl. ...................... 257/700; 257/723; 257/735; 438/109; 438/110
(58) Field of Classification Search ................ 257/637, 257/700
See application file for complete search history.

(56) References Cited

U.S. PATENT DOCUMENTS

| | | | |
|---|---|---|---|
| 5,847,464 A * | 12/1998 | Singh et al. ................. | 257/752 |
| 6,233,817 B1 * | 5/2001 | Ellis et al. ..................... | 29/832 |
| 6,538,210 B2 * | 3/2003 | Sugaya et al. .............. | 174/258 |
| 2004/0209399 A1 * | 10/2004 | Sunohara et al. ........... | 438/108 |

FOREIGN PATENT DOCUMENTS

JP 06-177295 6/1994

* cited by examiner

*Primary Examiner*—Leonardo Andujar
*Assistant Examiner*—Krista Soderholm
(74) *Attorney, Agent, or Firm*—Fish & Richardson P.C.

(57) ABSTRACT

A circuit device having a multilayered wiring structure and an excellent heat dissipation property, and a method of manufacturing the circuit device are provided. In a circuit device, a multilayered wiring structure including a first conductive pattern and a second conductive pattern is formed on a surface of a circuit substrate. A first insulating layer is formed entirely on the surface of the circuit substrate. The first conductive pattern and the second conductive pattern are mutually insulated by a second insulating layer. An amount and grain sizes of filler included in the second insulating layer are smaller than an amount and grain sizes of filler included in the first insulating layer. Therefore, it is easier to connect the above two conductive patterns by way of penetrating the second insulating layer.

9 Claims, 14 Drawing Sheets

CIRCUIT DEVICE AND MANUFACTURING METHOD THEREOF

BACKGROUND OF THE INVENTION

Priority is claimed to Japanese Patent Application Number JP2004-162654 filed on May 31, 2004, the disclosure of which is incorporated herein by reference in its entirety.

1. Field of the Invention

The present invention relates to a circuit device and a manufacturing method thereof, more particularly, to a circuit device including multilayered conductive patterns formed on a surface of a circuit substrate, and a manufacturing method thereof.

2. Description of the Related Art

A configuration of a conventional hybrid integrated circuit device will be described with reference to FIGS. 14A and 14B (this technology is described for instance in Japanese Patent Publication No. 6(1994)-177295 (p.4, FIG. 1)). FIG. 14A is a perspective view of hybrid integrated circuit device 100, and FIG. 14B is a cross-sectional view taken along the X–X' line in FIG. 14A.

The conventional hybrid integrated circuit device 100 has a configuration as follows. The hybrid integrated circuit device 100 includes: a substrate 106 which is rectangular, an insulating layer 107 formed on a surface of the substrate 106; a conductive patterns 108 formed on this insulating layer 107; circuit elements 104 fixed onto the conductive patterns 108; metal thin wires 105 electrically connecting the circuit elements 104 to the conductive patterns 108; and leads 101 electrically connected to the conductive patterns 108. Moreover, the hybrid integrated circuit device 100 is entirely sealed by sealing resin 102.

Today, high-performance and high-output elements such as a system LSI are incorporated in hybrid integrated circuit devices. To incorporate such an element having numerous pins, it is necessary to form more complicated patterns inside a device and to ensure a high heat dissipation property. However, in the above-described hybrid integrated circuit device 100, it was difficult to cross wires because the conductive patterns 108 adopted a single-layer wiring structure. It is also possible to consider a configuration to use jumper wires in order to allow the conductive patterns 108 intersect. However, when the jumper wires are used, there is a risk that parasitic inductance occurs on locations of the jumper wires. Moreover, in consideration of the case where multilayered wiring is formed on the surface of the circuit substrate 106, there is also a problem of degradation in heat dissipation property of the entire device.

Meanwhile, in consideration of the case where a printed board including multilayered wiring is used as the circuit substrate 106, there is a problem that it is difficult to incorporate elements generating a high quantity of heat because the printed board has a poor heat dissipation property. Moreover, in consideration of the case of adopting a ceramic substrate, there is a problem of large wiring resistance.

SUMMARY OF THE INVENTION

The present invention has been made in consideration of the foregoing problems. The present invention provides a circuit device including a multilayered wiring structure with an excellent heat dissipation property, and a method of manufacturing the circuit device.

A circuit device of the present invention includes: a circuit substrate, a first insulating layer formed on a surface of the circuit substrate; a first conductive pattern formed on a surface of the first insulating layer; a second insulating layer covering the first conductive pattern; and a second conductive pattern laminated on the first conductive pattern with the second insulating layer interposed between the first and second conductive patterns and is characterized in that filler is mixed in each of the insulating layers, and a larger amount of filler is mixed in the first insulating layer than in the second insulating layer.

Moreover, another circuit device of the present invention includes: a circuit substrate; a first insulating layer formed on a surface of the circuit substrate; a first conductive pattern formed on a surface of the first insulating layer; a second insulating layer covering the first conductive pattern; and a second conductive pattern laminated on the first conductive pattern with the second insulating layer interposed between the first and second conductive patterns. Here, filler is mixed in each of the insulating layers, and an average grain size of the filler included in the first insulating layer is greater than that of the filler included in the second insulating layer.

A method of manufacturing a circuit device of the present invention includes the steps of: preparing a circuit substrate; forming a first insulating layer, in which filler is mixed, on a surface of the circuit substrate; forming a first conductive pattern on a surface of the first insulating layer; forming a second insulating layer having a smaller content of the filler than the first insulating layer in a manner that it covers the first conductive pattern; and forming a second conductive pattern which is electrically connected to the first conductive pattern by way of penetrating the second insulating layer.

Moreover, another method of manufacturing a circuit device of the present invention includes the steps of: preparing a circuit substrate; forming a first insulating layer in which filler is mixed on a surface of the circuit substrate; forming a first conductive pattern on a surface of the first insulating layer; forming a second insulating layer having the filler with a maximum grain size smaller than the first insulating layer in a manner it covers the first conductive pattern, and forming a second conductive pattern so that it penetrates the second insulating layer and to be electrically connected to the first conductive pattern.

According to the present invention, multilayered conductive patterns are laminated on a surface of a circuit substrate with insulating layers, in which filler is mixed, interposed between nearest two of the multilayered conductive patterns, and the larger amount of the filler is mixed in the insulating layer formed on the surface of the circuit substrate as compared to the other insulating layers. Alternatively, the average grain size of the filler included in the first insulating layer is set greater than the average gain sizes of the filler included in the other layers. Therefore, it is possible to obtain the circuit device including the multilayered wiring with an enhanced heat dissipation property.

Moreover, according to the manufacturing method of a circuit device of the present invention, a smaller amount of filler is mixed in the insulating layer, on which a connecting portion is formed for connecting the respective conductive patterns on the multiple layers to each other in comparison with the other layer. Therefore, it is possible to connect the conductive patterns electrically to each other by way of penetrating this insulating layer. Alternatively, it is also possible to facilitate formation of the connecting portion by having the filler with a smaller average grain size included in the insulating layer provided with this connecting portion as compared to the filler included in the other layer.

DESCRIPTION OF THE PREFERRED EMBODIMENTS

Figure 1A:
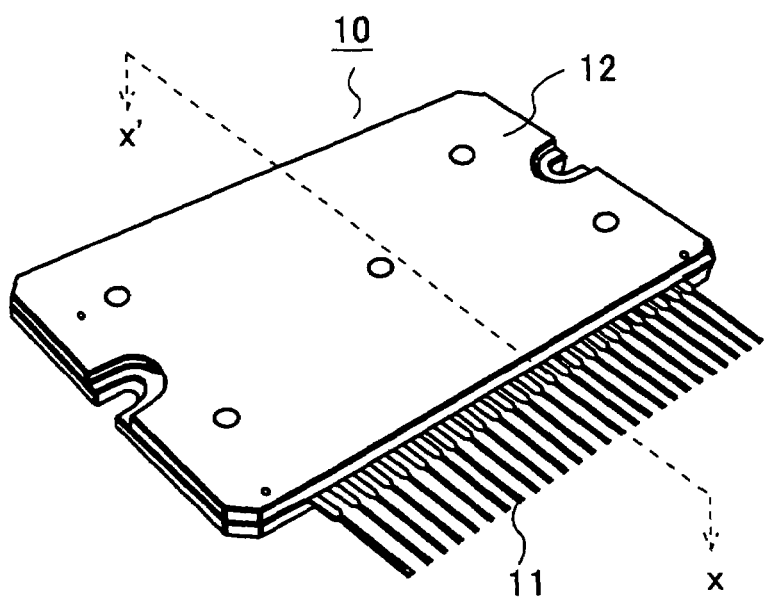
FIG. 1A is a perspective view and FIGS. 1B and 1C are cross-sectional views of a hybrid integrated circuit device of the present invention.
Figure 1B:
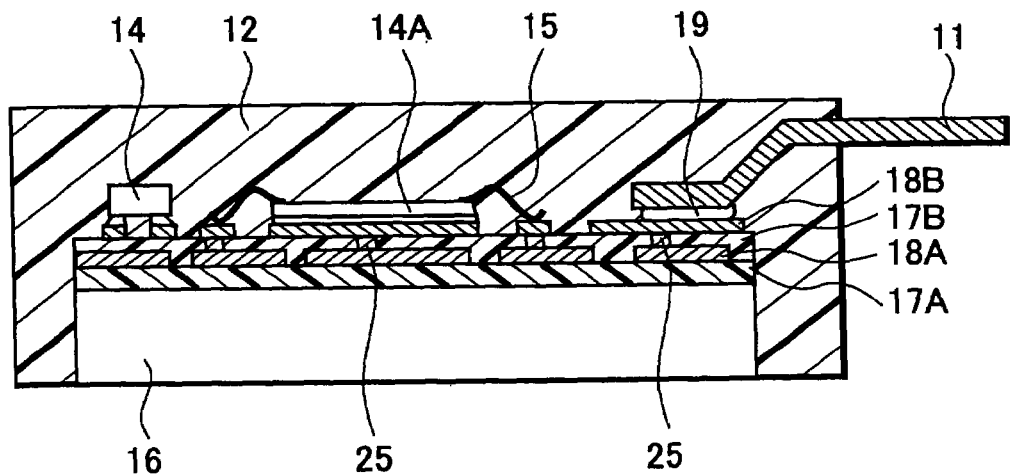
Figure 1C:
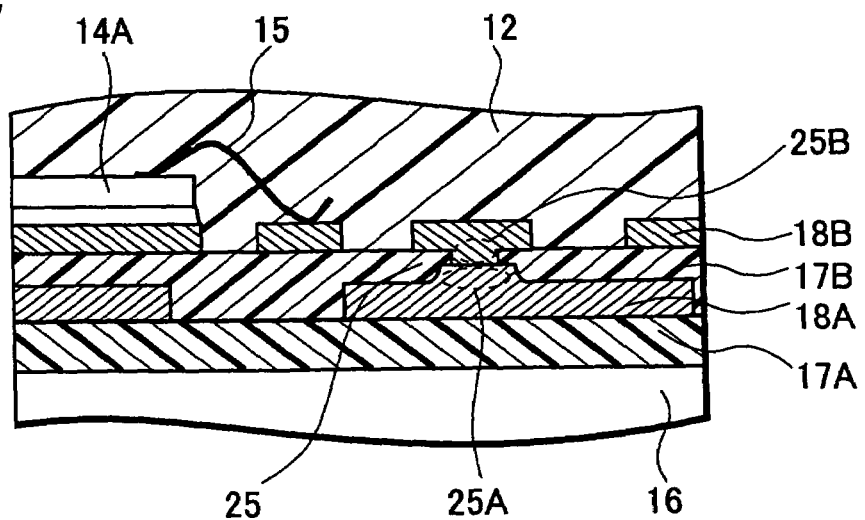

An embodiment will be described based on a hybrid integrated circuit device as an example of a circuit device. A configuration of a hybrid integrated circuit device 10 of the present invention will be described with reference to FIGS. 1A to 1C. FIG. 1A is a perspective view of the hybrid integrated circuit device 10. FIG. 1B is a cross-sectional view taken along the X–X' line in FIG. 1A. FIG. 1C is an enlarged view of a cross section in the vicinity of a connecting portion 25.

A substrate made of metal, a ceramic or the like is suitable for a circuit substrate 16 in light of heat dissipation. As for the material of the circuit substrate 16, it is possible to apply Al, Cu, Fe or the like as the metal, and to apply $Al_2O_3$ or AlN as the ceramic. In addition, it is also possible to apply a material which is excellent in mechanical strength and in heat dissipation property as the material of the circuit substrate 16. In this embodiment, an insulating layer 17 is formed on a surface of the circuit substrate made of aluminum, and conductive patterns 18 are formed on a surface of the insulating layers 17. Meanwhile, in this embodiment, metal containing copper as a main ingredient may be used as the material of the circuit substrate 16. Since copper is the material having excellent thermal conductivity, copper can enhance a heat dissipation property of the entire device. Meanwhile, when Al is applied to the material of the circuit substrate 16, an oxide film may be formed on the surface of the circuit substrate 16.

First insulating layer 17A is formed on the surface of the circuit substrate 16 so that it covers substantially the entire area thereof. Resin filled with filler is applicable as the first insulating layer 17A. As the filler, it is possible to apply an aluminum compound, a calcium compound, a potassium compound, a magnesium compound or a silicon compound, for example. Meanwhile, as resin used for sealing resin 12, it is possible to apply both of thermoplastic resin and thermosetting resin generally. Moreover, a larger amount of the filler is contained in the first insulating layer 17A as compared to another insulating layer in order to enhance the heat dissipation property of the entire device, and a weight-filling ratio of the filler in the first insulating layer 17A is set in a range from about 60% to 80%, for example. Furthermore, it is also possible to enhance the heat dissipation property by mixing filler having large grain diameters equal to or above 50 μm in the first insulating layer 17A. Although the thickness of the first insulating layer 17A varies depending on required breakdown voltage, the thickness may be set roughly in a range from 50 μm to several hundred micrometers.

A first conductive pattern 18A is made of metal such as copper, and is patterned on a surface of the insulating layer 17A. This first conductive pattern 18A is electrically connected to a second conductive pattern 18B of the upper layer, and has a function mainly to route a pattern around.

A second insulating layer 17B is formed above the surface of the circuit substrate 16 so that it covers the first conductive pattern 18A. Moreover, the connecting portion 25 for electrically connecting the first conductive pattern 18A and the second conductive pattern 18B is formed so that it penetrates the second insulating layer 17B. Therefore, a smaller amount of the filler as compared to the first insulating layer 17A is mixed in the second insulating layer 17B in order to facilitate formation of the connecting portion 25. Moreover, for the same reason, an average grain size of the filler included in the second insulating layer 17B is set smaller than an average grain size of the filler included in the first insulating layer 17A.

The second conductive pattern 18B is formed on a surface of the second insulating layer 17B. Moreover, the second conductive pattern 18B forms pads for placing circuit elements 14, wiring portions for connecting the respective pads, pads to which leads 11 are fixed, and the like. The second conductive pattern 18B and the first conductive pattern 18A can be formed to intersect each other in a plane. Therefore, even when semiconductor element 14A includes numerous electrodes, it is possible to route patterns around freely by use of the multilayered wiring structure of the present invention.

The connecting portion 25 is a region penetrating the second insulating layer 17B and thereby electrically connecting the first conductive pattern 18A and the second conductive pattern 18B.

The circuit elements 14 are fixed onto the second conductive pattern 18B, and the circuit elements 14 and the conductive patterns 18 collectively constitute a given electric circuit. Active elements such as transistors or diodes, and passive elements such as capacitors or resistors are applied to the circuit elements 14. Meanwhile, an element generating a large quantity of heat such as semiconductor element of a power type may be fixed to the circuit substrate 16 via a heat sink made of metal. Here, an active element or the like to be mounted face up is electrically connected to the second conductive pattern 18B by use of metal thin wires 15.

The semiconductor element 14A is a semiconductor element including several tens or several hundreds of pads on a surface thereof. Moreover, it is also possible to apply a so-called system LSI as the semiconductor element 14A. Here, the system LSI is an element including at least any of an analog arithmetic circuit, a digital arithmetic circuit, and a storage region, the element which is configured to realize a system function with a single LSI. Therefore, as compared to a conventional LSI, the system LSI operates while generating a large quantity of heat.

Moreover, when a rear surface of the semiconductor element 14A is connected to ground potential, the rear surface of the semiconductor element 14A is fixed by use of a brazing material, conductive paste or the like. On the other hand, when the rear surface of the semiconductor element 14A is set to floating potential, the rear surface of the semiconductor element 14A is fixed by use of an insulative adhesive. Here, when the semiconductor element 14A is mounted face down, the semiconductor element 14A is mounted by use of bump electrodes made of solder and the like.

Moreover, a power type transistor for controlling a large current such as a power metal-oxide semiconductor (MOS) transistor, a grounded-trench-metal-oxide-semiconductor assisted bipolar-mode field effect transistor (GTBT), an insulated gate bipolar transistor (IGBT) or a thyristor can be adopted as the semiconductor element 14A. In addition, a power type IC is also applicable. In recent years, as a chip has become smaller in size and is formed into a thinner profile with a higher performance, heat generation by such a chip has been increasing. A typical example of such a chip is a CPU for controlling a computer.

The leads 11 are fixed to the second conductive pattern 18B in the periphery of the circuit substrate 16, and have input and output functions to and from outside, for example. Here, the numerous leads 11 are provided on one edge. Adhesion of the leads 11 to the pattern is achieved by use of brazing material 19 such as solder.

The sealing resin 12 is formed either by transfer molding using the thermosetting resin or by injection molding using the thermoplastic resin. Here, the sealing resin 12 is formed so that it seals the circuit substrate 16 and the electric circuit formed on the surface thereof, and a rear surface of the circuit substrate 16 is exposed out of the sealing resin 12. Moreover, sealing methods other than molding are applicable to the hybrid integrated circuit of this embodiment. Specifically, publicly known sealing methods such as a sealing method utilizing resin potting or a sealing method using a casing member are applicable. As shown in FIG. 1B, in order to suitably discharge the heat generated by the circuit elements 14 placed on the surface of the circuit substrate 16, the rear surface of the circuit substrate 16 is exposed out of the sealing resin 12. Alternatively, it is also possible to seal the entire surface of the circuit substrate 16 including the rear surface by use of the sealing resin 12 in order to enhance moisture resistance of the entire device.

Details of the connecting portion 25 will be described with reference to FIG. 1C. This cross-sectional view is an enlarged cross-sectional view of the hybrid integrated circuit device 10 with respect to the connecting portion 25 and in the vicinity thereof. The connecting portion 25 is a region configured to penetrate the insulating layer to conduct the laminated conductive patterns. Alternatively, it is possible to use the connecting portion 25 as a thermal via hole to provide a thermal connection between the conductive patterns 18.

In this embodiment, the connecting portion 25 is formed of a first connecting portion 25A and a second connecting portion 25B. The first connecting portion 25A is a region protruding in the thickness direction continuously from the first conductive pattern 18A. Here, the first connecting portion 25A protrudes upward and is buried in the second insulating layer 17B. The second connecting portion 25B is a region protruding in the thickness direction continuously from the second conductive pattern 18B. Here, the second connecting portion 25B protrudes downward and is buried in the second insulating layer 17B.

The first connecting portion 25A is a region formed by an etching process so that it protrudes in the thickness direction, which is made of a Cu foil formed by plating or rolling. In addition, it is also possible to form the first connecting portion 25A in accordance with methods other than the etching process. To be more precise, it is possible to form the first connecting portion 25A by growing an electrolytic plating film or an electroless plating film in a convex shape on a surface of the first conductive pattern 18A. Moreover, it is also possible to form the first connecting portion 25A by providing a conductive material including a brazing material such as solder, a silver paste, and the like, in a convex shape on the surface of the first conductive pattern 18A. In this embodiment, a location where the first connecting portion 25A and the second connecting portion 25B make contact is in the middle of the thickness direction. Therefore, it is possible to enhance connection reliability of the location where these connecting portions meet.

Figure 2:
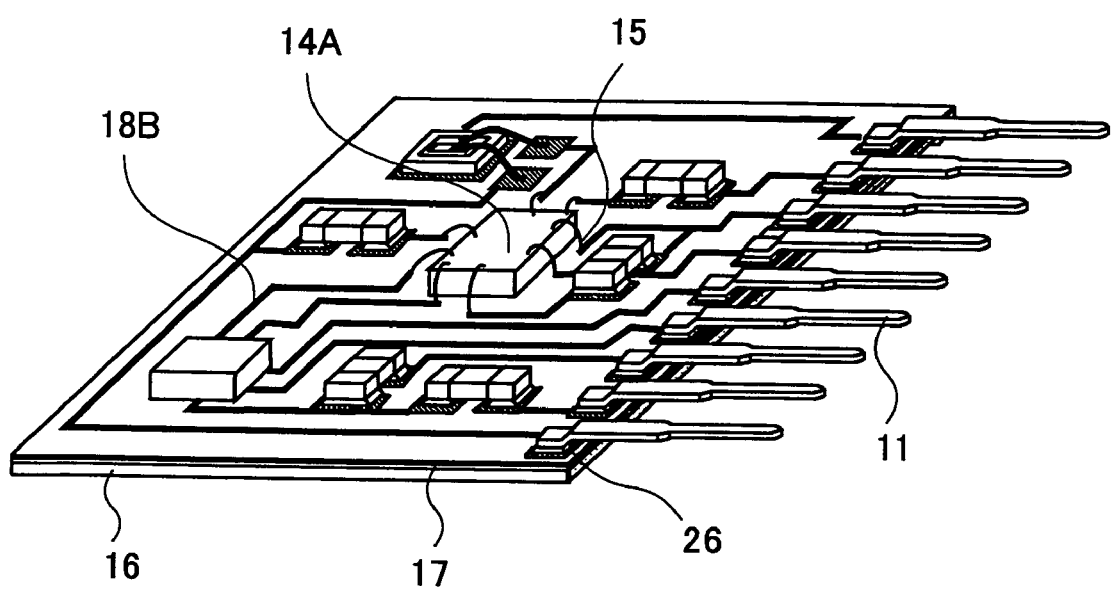
FIG. 2 is a perspective view of the hybrid integrated circuit device of the present invention.

An example of a concrete shape of the second conductive pattern 18B to be formed on the surface of the circuit substrate 16 will be described with reference to a perspective view of FIG. 2. In this drawing, an illustration of the sealing resin for covering the entire device is omitted.

As shown in the drawing, the second conductive pattern 18B includes the bonding pads on which the circuit elements 14 are mounted, pads 26 to which the leads 11 are fixed, and the like. Meanwhile, numerous pads to which the metal thin wires 15 are wire bonded are formed in the periphery of the semiconductor element 14A. When the semiconductor element 14A including the numerous bonding pads is placed, if the device only includes the single-layer pattern of the second conductive pattern 18B, there is a risk that sufficiently routing patterns is not possible due to a limitation of wiring density. In this embodiment, it is possible to route complicated patterns around by building the multilayered wiring structure on the surface of the circuit substrate 16.

Figure 3A:
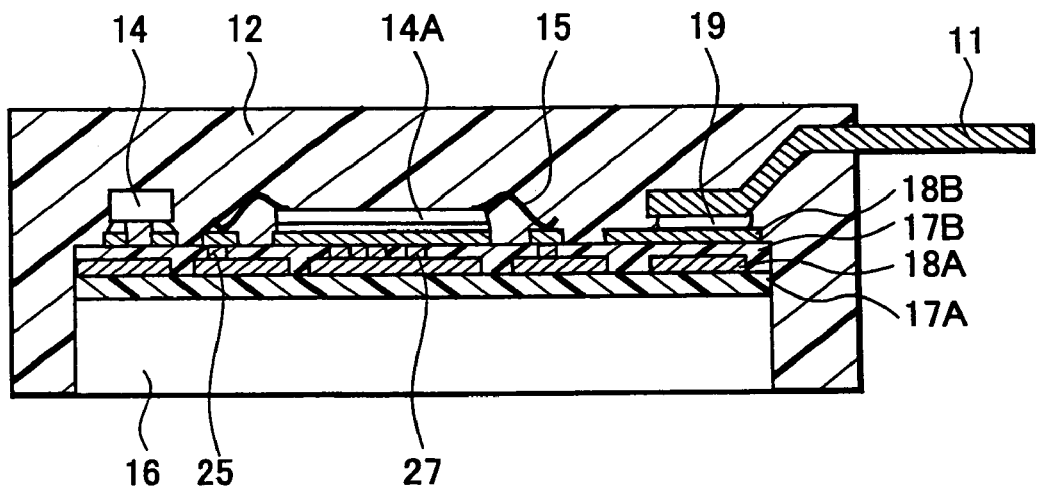
FIGS. 3A and 3B are cross-sectional views of another hybrid integrated circuit device of the present invention.
Figure 3B:
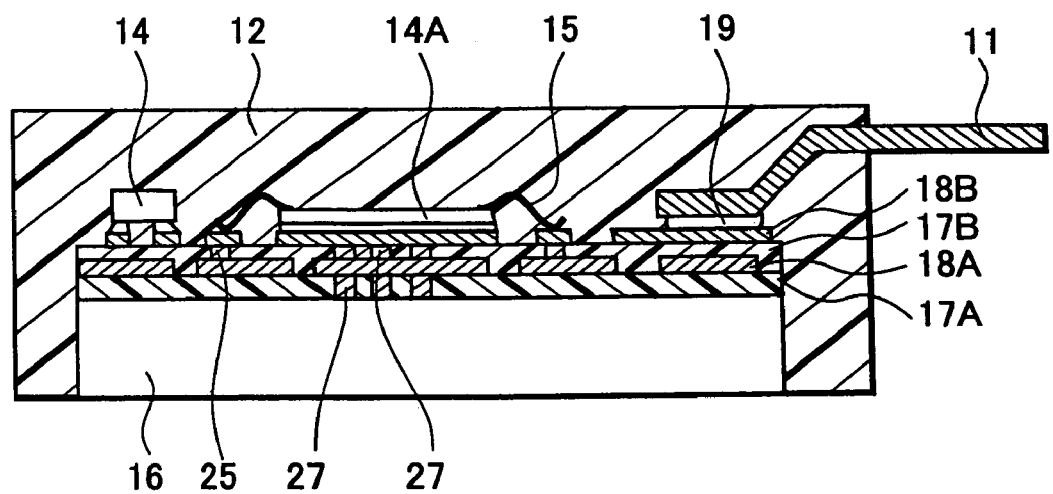

A configuration of a hybrid integrated circuit device of another embodiment will be described with reference to FIGS. 3A and 3B. FIGS. 3A and 3B are cross-sectional views of a hybrid integrated circuit device of another embodiment.

As shown in FIG. 3A, thermal via holes 27 are formed herein so that they penetrate a second insulating layer 17B. The thermal via holes 27 are regions formed by filling metal in holes penetrating the second insulating layer 17B, which function as a path of heat to the outside. Therefore, it is not always necessary that the thermal via holes 27 be conducted. To be more precise, the thermal via holes 27 are formed to conduct a bottom surface of a second conductive pattern 18B in a land shape to which a semiconductor element 14A is fixed. Therefore, even if a lot of heat is generated by the semiconductor element 14A, the heat is transmitted to a circuit substrate 16 through the multiple thermal via holes 27. In this case, the path of the heat is equivalent to a sequence in the order of the semiconductor element 14A, the second conductive patterns 18B, the thermal via holes 27, a first insulating layer 17A, the circuit substrate 16, and the outside.

As shown in FIG. 3B, the thermal via holes 27 are formed on both of the first insulating layer 17A and the second insulating layer 17B. As described previously, the first insulating layer 17A containing the large amount of the filler has the excellent heat dissipation property. Therefore, by providing the first insulating layer 17A with the thermal via holes 27 as shown in the drawing, it is possible to further enhance the heat dissipation property. The thermal via holes 27 to be provided on the first insulating layer 17A may be formed in the region corresponding to the bottom of the semiconductor element 14A which generates the heat.

Figure 4A:
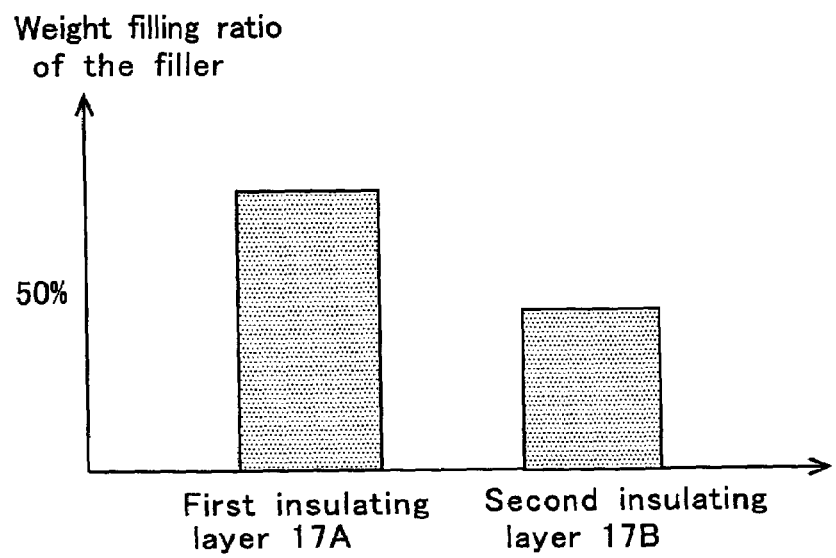
FIGS. 4A and 4B are graphs showing characteristics of filler applied to the hybrid integrated circuit device of the present invention.
Figure 4B:
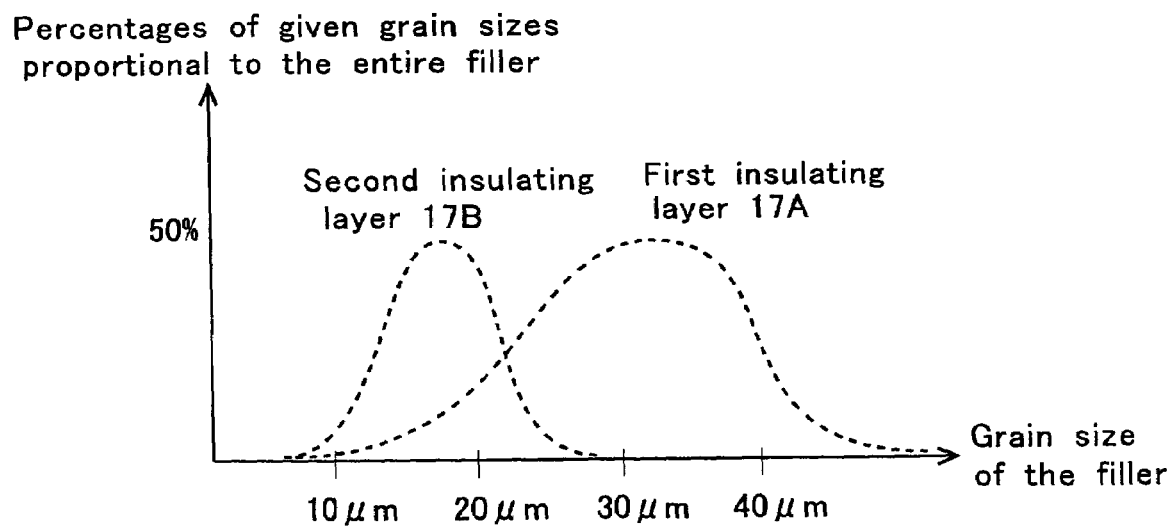

Next, details of the filler to be filled in the above-described insulating layers will be described with reference to FIGS. 4A and 4B. FIG. 4A is a graph showing amounts of the filler to be contained in the respective insulating layers, and FIG. 4B is a graph showing distribution of grain sizes of the filler contained in the respective layers.

In the graph of FIG. 4A, the longitudinal axis indicates a weight filling ratio of the filler. In terms of the first insulating layer 17A, the filler is filled in the resin at a high rate which may reach 80 wt %. Therefore, the first insulating layer 17A has extremely large thermal conductivity. To be more precise, the thermal conductivity of the first insulating layer 17A is set in a range from 5 W/m·K to 10 W/m·K.

On the other hand, the filling ratio of the filler in the second insulating layer 17B is smaller than the filling ratio of the filler in the first insulating layer 17A, because the connecting portion 25 for mutually connecting the conductive patterns 18 is drilled on the second insulating layer 17B. In other words, if a large amount of the filler is mixed in the second insulating layer 17B, it is difficult to drill the hole for forming the connecting portion 25. In this regard, the filling ratio of the filler in the second insulating layer 17B is appropriately determined so that it ensures operability for forming the connecting portion 25 and the heat dissipation property at the same time.

Distribution of the grain sizes of the filler to be filled in the respective insulating layers 17 will be described with reference to FIG. 4B. The lateral axis of the graph shown in this drawing indicates grain sizes of the filler, and the longitudinal axis indicates percentages of given grain sizes proportional to the entire filler.

A grain size distribution curve of the filler included in the first insulating layer 17A forms a distribution shape which is equivalent to normal distribution having a peak at approximately 35 μm. Moreover, as the width of the grain size distribution is large, it is apparent that the filler included in the first insulating layer 17A has a wide range of grain sizes. Therefore, the grains of the filler in smaller sizes are diffused into spaces among the grains of the filler in larger sizes. In this way, the heat dissipation property of the filler is remarkably enhanced. Although the peak of the grain size distribution is located around 35 μm in this case, it is also possible to move this peak. Alternatively, it is also possible to adopt the filler which forms multiple peaks in the grain size distribution.

In a grain size distribution curve of the filler included in the second insulating layer 17B, the grain sizes are shifted to smaller sizes as compared to the distribution curve of the filler included in the first insulating layer 17A. Specifically, the grain sizes of the filler included in the second insulating layer 17B are smaller than the grain sizes of the filler included in the first insulating layer 17A. To be more precise, an average grain size and a maximum grain size of the filler included in the second insulating layer 17B are smaller respectively than an average grain size and a maximum grain size of the filler included in the first insulating layer 17A. Since the amount of the filler included is small and the grain sizes thereof are also small, it is easier to form through holes on the second insulating layer 17B by use of a laser or the like. Details on this point will be described later.

Figure 5A:
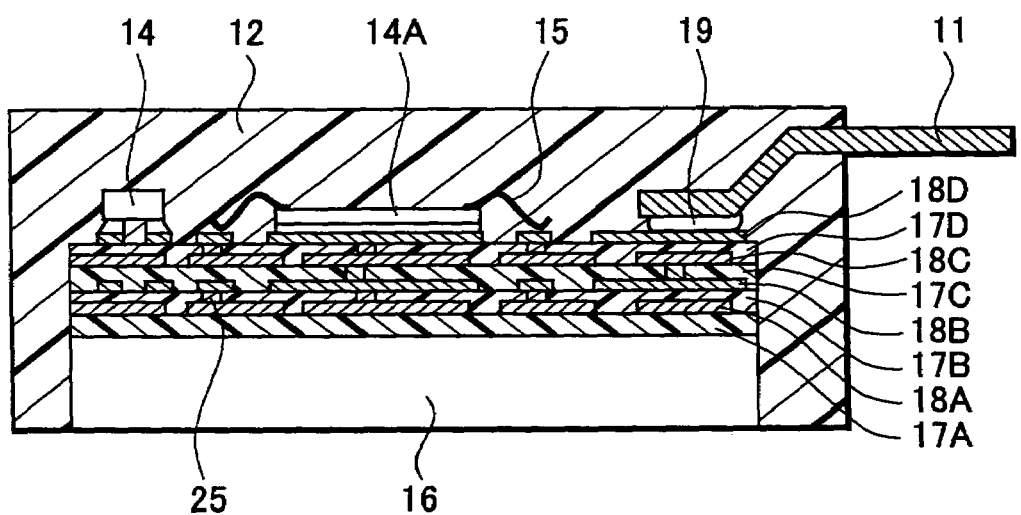
FIGS. 5A and 5B are cross-sectional views of still another hybrid integrated circuit device of the present invention.
Figure 5B:
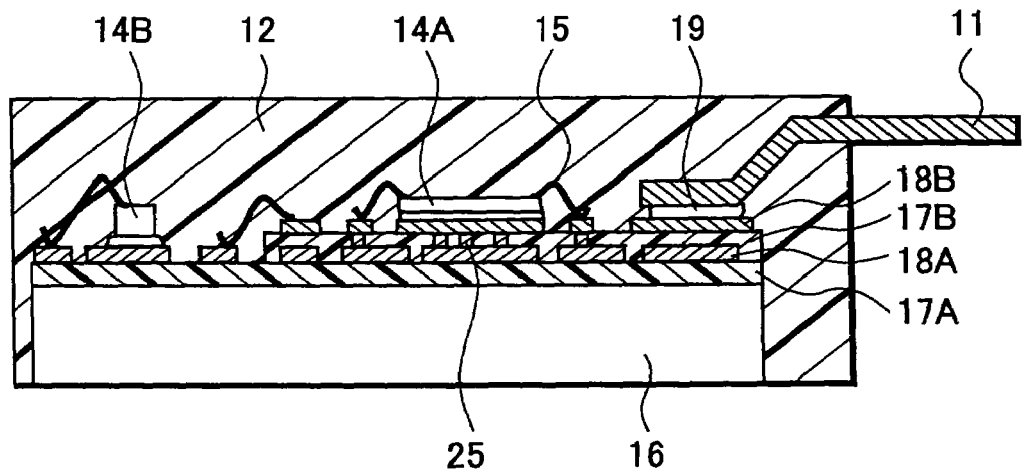

A structure of a hybrid integrated circuit device of still another embodiment will be described with reference to FIGS. 5A and 5B. FIGS. 5A and 5B are cross sectional views of still another hybrid integrated circuit device.

As shown in FIG. 5A, a wiring structure including four layers is formed herein by laminating conductive patterns 18 so that the conductive patterns 18 interpose insulating layers 17 inserted under the respective conductive patterns. To be more precise, a first conductive pattern 18A is formed on an upper surface of first insulating layer 17A. Then, a second conductive pattern 18B, a third conductive pattern 18C, and a fourth conductive pattern 18D are sequentially laminated while a second insulating layer 17B, third insulating layer 17C, and fourth insulating layer 17D, are inserted under the respective conductive patterns. It is possible to increase wiring density by increasing the number of layers of the conductive patterns 18 as described above. Connecting portions 25 are formed in the second to fourth insulating layers 17B to 17D for connecting the conductive patterns on the respective layers. Therefore, smaller amounts of the filler than the first insulating layer 17A are mixed in the second insulating layer 17B and the other insulating layers located above. In this way, it is easier to form the connecting portions 25.

As shown in FIG. 5B, a multilayered wiring structure is formed herein on a surface of a circuit substrate 16 in a region on which a semiconductor element 14A having a large number of pads is placed, and a single layer wiring structure is formed on the surface of the circuit substrate 16 in a region to which the circuit element 14 is fixed.

The semiconductor element 14A is an element having several tens to several hundreds of electrodes as described previously. Therefore, the multilayered wiring structure is formed in the vicinity of the semiconductor element 14A in order to draw patterns to be connected to the electrodes of the semiconductor element 14A. To be more precise, the multilayered wiring structure including the first conductive pattern 18A and the second conductive pattern 18B is formed.

Meanwhile, a portion of the second conductive pattern 18B formed into the multiple layers is electrically connected to a portion of the first conductive pattern 18A formed into a single layer.

A circuit element 14B is a semiconductor element of a power type, which is a switching element generating a large quantity of heat. A region of the circuit substrate 16 where the single wiring structure including the first conductive pattern 18A is formed has a larger heat dissipation effect as compared to other regions. Therefore, a discrete transistor causing a large amount of heat generation such as the circuit element 14B may be fixed directly to the first conductive pattern 18A constituting the single layer wiring structure.

Next, a method of manufacturing the above-described integrated circuit devices will be described with reference to FIG. 6A to FIG. 9.

Figure 6A:
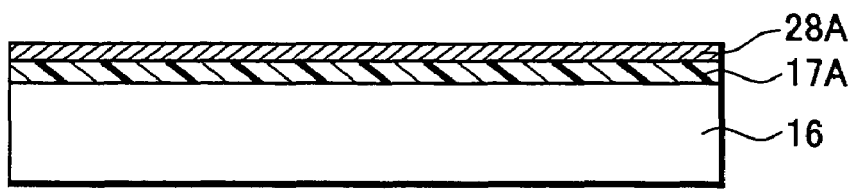
FIGS. 6A to 6D are cross-sectional views showing a method of manufacturing a hybrid integrated circuit device of the present invention.

Firstly, as shown in FIG. 6A, a first conductive film 28A is crimped to a surface of circuit substrate 16 while a first insulating layer 17A is interposed therebetween. This process can be achieved by coating the first insulating layer 17A on the surface of the circuit substrate 16 and then attaching the first conductive film 28A to the first insulating layer 17A. Alternatively, this process can be achieved by attaching the first conductive film 28A provided with the first insulating layer 17A on a rear surface thereof to the surface of the circuit substrate 16. As for the material of the circuit substrate, it is possible to adopt a material containing cupper as a main ingredient or a material containing either Fe—Ni or Al as a main ingredient. To achieve mechanical support of patterns to be formed on the surface, the thickness of the circuit substrate 16 is set in a range from about 1 to 2 mm. Moreover, when copper is applied to the material of the circuit substrate 16, it is possible to enhance a heat dissipation effect because copper exerts excellent heat conductivity.

Figure 6B:
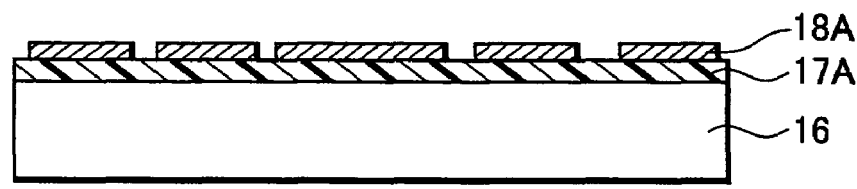

Next, as shown in FIG. 6B, a first conductive pattern 18A is obtained by patterning the first conductive film 28A. This patterning process can be achieved by wet etching using an etchant.

Figure 6C:
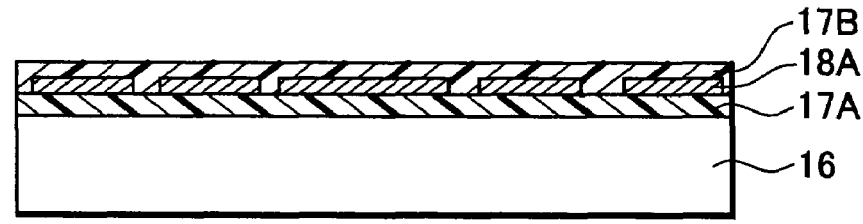

Next, as shown in FIG. 6C, a second insulating layer 17B is coated so that it covers the first conductive pattern 18A. A smaller amount of the filler as compared to the above-described first insulating layer 17A is mixed in the second insulating layer 17B. In this way, it is possible to form the second insulating layer 17B while suppressing occurrence of voids. Formation of the second insulating layer 17B can be achieved by attaching a resin film of a sheet shape with a vacuum press. Alternatively, it is possible to form the second insulating layer 17B by coating liquid resin.

Figure 6D:
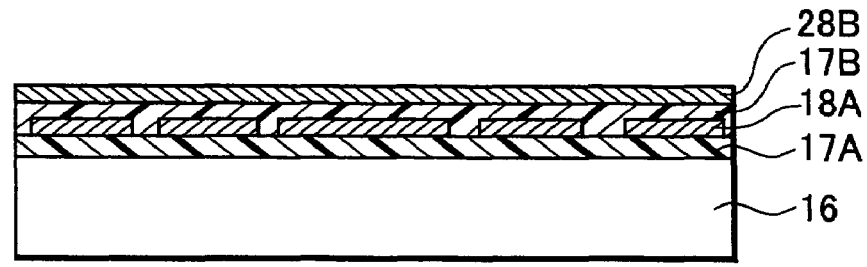

Next, as shown in FIG. 6D, a second conductive film 28B is attached to an upper surface of the second insulating layer 17B. In the above-described process, the second insulating film 17B and the second conductive film 28B are formed separately. However, it is also possible to closely attach the second conductive film 28B including the second insulating layer 17B adhered to a rear surface thereof, so that it covers the first conductive pattern 18A.

Figure 7A:
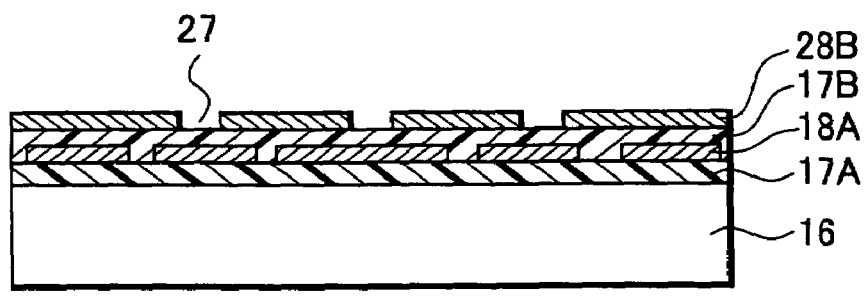
FIGS. 7A to 7D are cross-sectional views showing the method of manufacturing a hybrid integrated circuit device of the present invention.
Figure 7B:
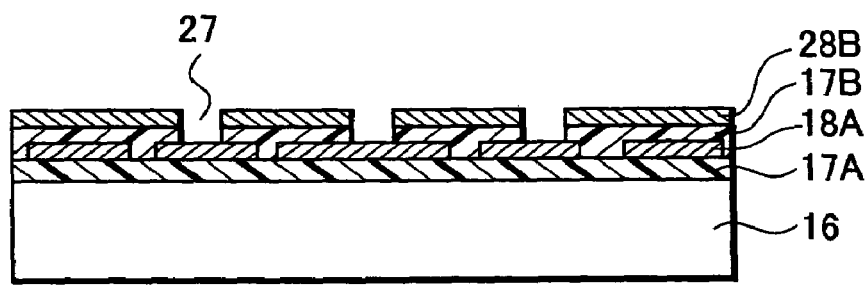
Figure 7C:
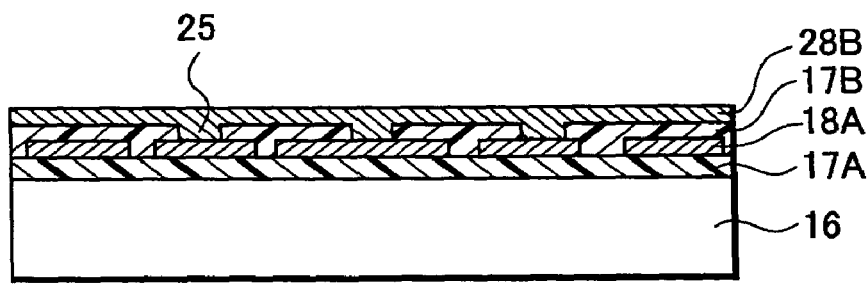

Next, contacting portions 25 for electrically connecting the first conductive pattern 18A and the second conductive pattern 18B are formed as shown in FIG. 7A to FIG. 7C.

As shown in FIG. 7A, through holes 27 are formed by partially removing the second conductive film 28B in regions targeted for forming the connecting portions 25. Formation of the connecting portions 25 can be achieved by wet etching using an etching mask.

As shown in FIG. 7B, the second insulating layer 17B exposed out of the through holes 27 is removed in accordance with a removing method using a laser or the like. Removal of the exposed second insulating layer 17B can be achieved by irradiating either a carbon dioxide gas laser or an excimer laser. In this process, a surface of the first conductive pattern 18A is exposed at the bottoms of the through holes 27.

When the second insulating layer 17B is removed by use of a laser, it is difficult to remove the filler contained therein by use of the laser as compared to the resin portion. As the amount of the filler contained therein is larger and diameters of the grains of the filler are increased, it is more difficult to remove the resin layer by use of the laser. Accordingly, in this embodiment, the second insulating layer 17B contains a relatively small amount of the filler in smaller grain sizes. In this way, it is possible to remove the second insulating layer 17B by use of a laser in this embodiment.

As shown in FIG. 7C, the connecting portions 25 are formed by forming a conductive film on a surface of the second conductive film 28B inclusive of the through holes 27. The connecting portions 25 can be formed in accordance with an electrolytic plating method, an electroless plating method, or a method combining electrolytic plating and electroless plating. To be more precise, in the method of forming the connecting portions 25, a metal film (such as copper) in the thickness of about 2 μm is formed on the entire surface of the second conductive film 28B at least including the through holes 27 by electroless plating. Subsequently, a metal film in the thickness of about 20 μm is plated by electrolytic plating. In this way, the through holes 27 are buried with the metal film and the connecting portions 25 are formed accordingly. Here, it is also possible to bury only the through holes 27 selectively by performing a filling plating method. Here, it is also possible to adopt Au, Ag, Pd, and the like as the plating film. Meanwhile, it is also possible to perform partial plating by use of a mask. Here, in this process, it is also possible to form the thermal via holes as shown in FIGS. 3A and 3B simultaneously in the same process.

Figure 7D:
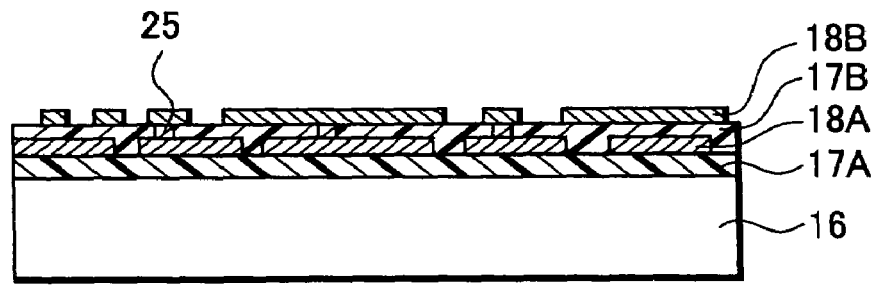

Subsequently, as shown in FIG. 7D, the second conductive pattern 18B is obtained by patterning the second conductive film 28B. In this process, the second conductive pattern 18B electrically connected to the first conductive pattern 18A therebelow is formed.

Now, details of processes after formation of the conductive patterns will be described below.

Figure 8A:
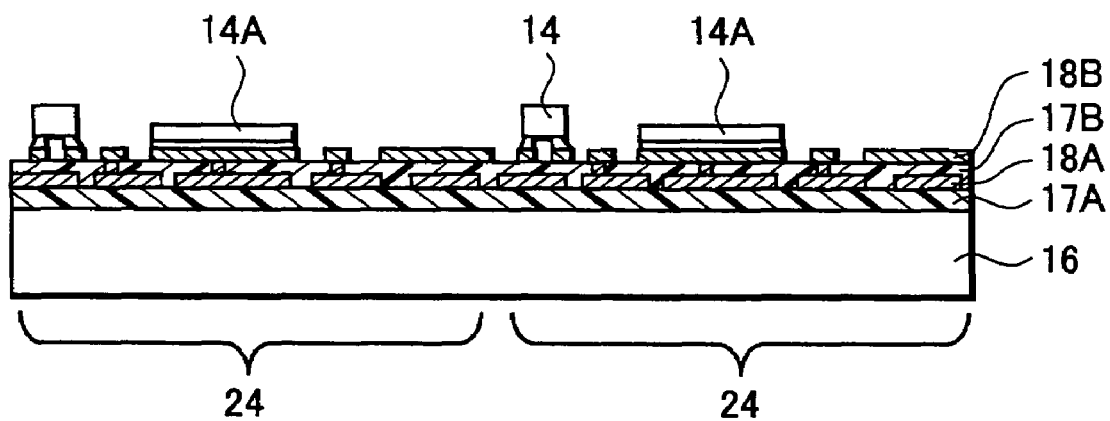
FIGS. 8A and 8B are cross-sectional views showing the method of manufacturing a hybrid integrated circuit device of the present invention.

As shown in FIG. 8A, firstly, circuit elements 14 are fixed to the second conductive pattern 18B by use of solder, a conductive paste or the like. Here, a plurality of units 24 each constituting a hybrid integrated circuit device are formed on the single circuit substrate 16. Then, it is possible to subject the respective units 24 to die bonding and wire bonding in a lump. Here, although semiconductor elements 14A are mounted face up, it can be mounted face down when appropriate. When a rear surface of the semiconductor element 14A is connected to the outside, it is possible to fix the semiconductor element 14A by use of a conductive adhesive. On the other hand, when the rear surface of the semiconductor element 14A is not connected to the outside, the semiconductor element 14A is fixed by use of an insulative adhesive.

Figure 8B:
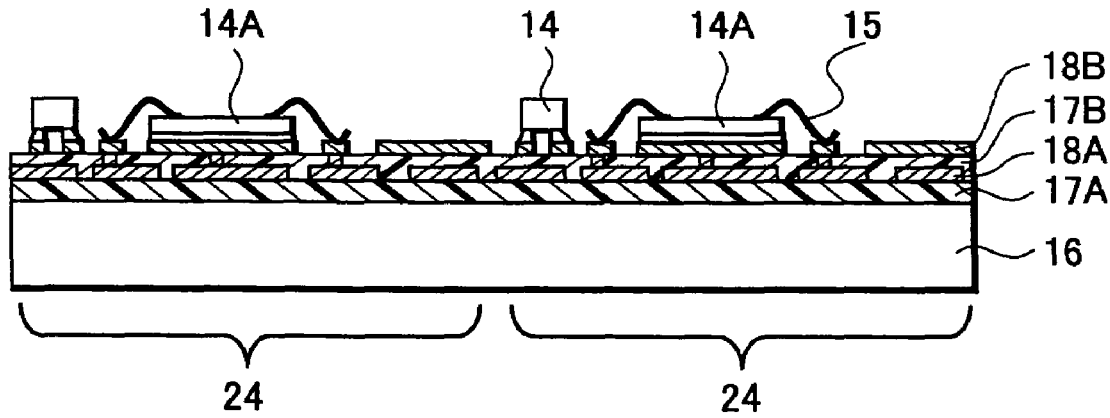

As shown in FIG. 8B, the semiconductor elements 14A are electrically connected to the conductive patterns 18 through metal thin wires 15.

The respective units 24 are separated after completing the above-described process. Separation of the respective units can be achieved by stamping out with a press machine, dicing, bending, or the like. Thereafter, leads 11 are fixed to the circuit substrate 16 of each of the units.

Figure 9:
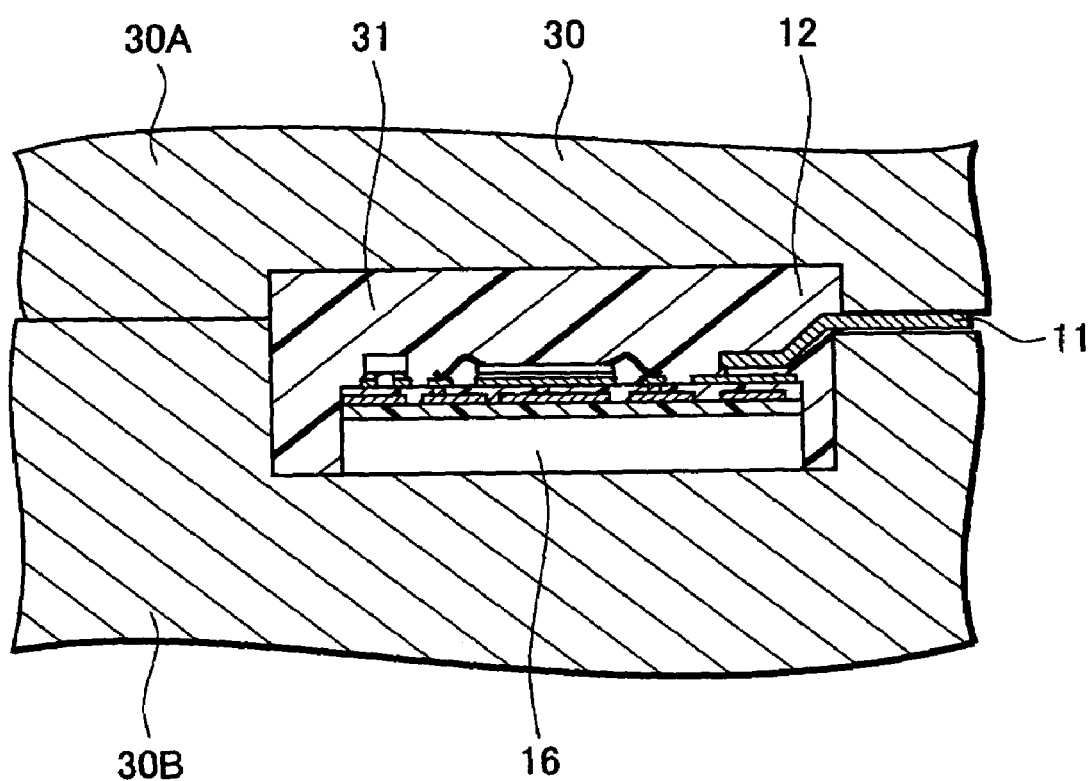
FIG. 9 is a cross-sectional view showing the method of manufacturing a hybrid integrated circuit device of the present invention.

As shown in FIG. 9, each of the circuit substrates 16 is sealed with resin. Here, the circuit substrate 16 is sealed by transfer molding with thermosetting resin. Specifically, the circuit substrate 16 is housed in mold 30 including upper mold 30A and lower mold 30B, and then the leads 11 are fixed by engaging the both molds together. Thereafter, the resin sealing process is achieved by filling the resin into cavity 31. The integrated circuit device shown in FIGS. 1A to 1C is manufactured by the above-described steps.

Along with development of higher-performance electronic instruments and home electric appliances in recent years, degrees of integration of semiconductor elements used therein are increased every year. Accordingly, countermeasures against increases in power consumption are needed. Moreover, in order to downsize these instruments, there is a strong demand for smaller sizes and thinner profiles in terms of the semiconductor elements and other electronic components to be embedded therein.

That is, in terms of a set formed by mounting numerous large-scale LSIs at high density on a hybrid integrated circuit substrate, there are more problems related to heat than before. As the outside measurements of a hybrid integrated circuit substrate are reduced, the problems related to heat become more serious.

The present invention provides a measure for solving these problems. Conventionally, the hybrid integrated circuit substrate such as a metal substrate has been considered as a block targeted for enhancing the heat dissipation property. On the other hand, the present invention considers that multiple insulating layers formed on a hybrid integrated circuit substrate are included as such a block targeted for heat dissipation. The present invention realizes this consideration by mixing filler in the insulating layers.

However, various problems arise when a large amount of filler is mixed in an insulating layer. In light of the thermal conductivity, it is desirable to the filling ratio of the filler as high as possible. However, if a large amount of the filler having small grain sizes is mixed, a total surface area of the filler is increased. As a consequence, there is a problem of high viscosity of the liquid resin upon formation of the insulating layer. That is, operability is substantially degraded when the liquid resin containing the filler is dripped onto and made spread over the substrate.

Viscosity of filler becomes lower if the filler having larger grain sizes is mixed, and it is possible to ensure operability. However, the filler having the larger grain sizes generates a large number of spaces. In this case, it is difficult to enhance the thermal conductivity of the resin. Accordingly, in the present invention, the grain size distribution of the filler is set in a wider range, whereby the filler having the smaller grain sizes is filled in the spaces generated by the filler having the larger grain sizes.

Meanwhile, when the multilayered wiring structure is formed on the hybrid integrated circuit substrate, the through holes or the connecting portions 25 are inevitable. However, when the filler is mixed, there is a problem related to workability of the holes.

This problem is due to the facts that the filler is typically made of an oxide of metal or of semiconductor, such as aluminum oxide and a silicon oxide film, and that the filler is hardly removed by use of the laser. There is also a problem that the filler exposed on side surfaces of the through holes are detached and irregularities are formed on inner surfaces of the through holes.

Accordingly, in this embodiment, the lowermost insulating layer which does not require the through holes can achieve the high heat conductivity by mixing the filler having the large grain sizes and the filler having the smaller grain sizes to be filled in the spaces. However, the upper insulating layers need to be filled with the filler having the smaller grain sizes than the filler in the lowermost insulating layer. In this way, it is possible to reduce energy of the laser required for forming the through holes on the resin layers, and to reduce the irregularities on the side surfaces of the through holes. As the irregularities on the side surfaces of the through holes are reduced, quality of the plating films formed inside the through holes is also enhanced.

Meanwhile, it is also necessary to open the through hole by use of the laser having a shorter wavelength than the carbon dioxide gas laser. For example, workability is improved by adopting a second harmonic wave (532 nm) of an yttrium-aluminum-garnet (YAG) laser, a third harmonic wave (355 nm) thereof, and the like.

As described above, upon realization of the multilayered wiring structure on the hybrid integrated circuit substrate, the lowermost resin layer is not provided with the through holes. Accordingly, the insulating layer including the filler having the large grain sizes and the filler having the smaller grain sizes to be filled in the spaces is adopted as the lowermost insulating layer. Meanwhile, the filler having the average grain size which is smaller than the average grain size of the filler filled in the lowermost insulating layer is mixed in the upper insulating layers. Accordingly, it is possible to ensure the heat dissipation property and the workability of the through holes at the same time.

A method of manufacturing a circuit device of another embodiment will be described with reference to FIG. 10A to FIG. 13. In the above-described embodiment, the multilayered conductive patterns are formed on the surface of the circuit substrate 16. In the following embodiment, a sheet including the multiple layers is formed in advance, and then this sheet is laminated on the surface of the circuit substrate 16.

Firstly, a process of preparing an insulative resin sheet 40 will be described with reference to FIGS. 10A to 10E.

The insulative resin sheet 40 is formed by covering entirely a front surface and a rear surface of an insulating resin 41 with a conductive foil. Moreover, the material of the insulative resin 41 is made of an insulating material made of a polymer such as polyimide resin or epoxy resin. Meanwhile, a first conductive foil 42 and a second conductive foil 43 may be made of a material containing Cu as a main ingredient or a publicly known material used for forming a lead frame. The thickness of a conductive film is set in a range from 9 μm to several hundred micrometers.

Polyimide resin, epoxy resin, and the like are suitable for the insulative resin 41. In a casting method for forming the sheet by coating a paste-like material, the film thickness is set in a range from about 10 μm to 100 μm. When heat conductivity is considered, filler is mixed in the insulative resin 41. An amount of the filler to be mixed in the insulative resin 41 may be smaller than the filler mixed in first insulating layer 17A to be formed on a surface of circuit substrate 16. Moreover, it is also possible to mix the filler in the insulative resin 41, which has smaller grain sizes than the filler in the first insulating layer. In this way, it is easier to form through holes in a subsequent process.

A process of electrically connecting the first conductive foil 42 to the second conductive foil 43 through connecting portions 25 will be described with reference to FIG. 10B to FIG. 10D.

Figure 10A:
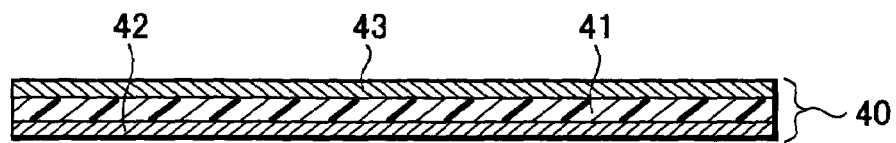
FIGS. 10A to 10E are cross-sectional views showing another method of manufacturing a hybrid integrated circuit device of the present invention.
Figure 10B:
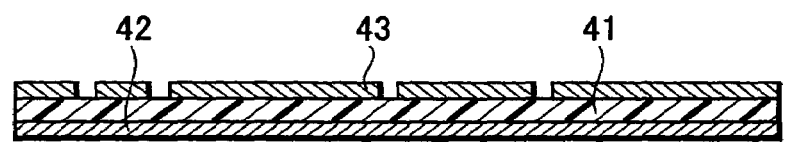

Firstly, as shown in FIG. 10B, portions for forming through holes 27 on the second conductive foil 43 are subjected to etching. As the second conductive foil 43 contains Cu as the main ingredient, chemical etching is performed herein by use of either ferric chloride or cupric chloride as an etchant. Moreover, in the course of this etching process, the first conductive foil 42 is covered with an adhesive sheet or the like in order to protect the first conductive foil 42 against the etchant. However, if the first conductive foil 42 is thick enough to be capable of maintaining flatness after the etching process, the first conductive foil 42 may be etched to some extent.

Figure 10C:
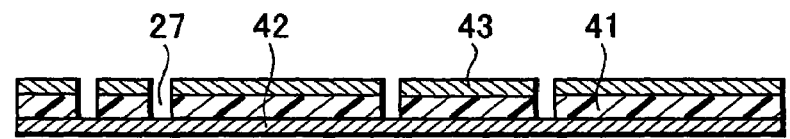

As shown in FIG. 10C, the insulative resin 41 immediately below the through holes 27 is removed by use of a laser while using the second conductive foil 43 as a mask, whereby a rear surface of the first conductive foil 42 is exposed at the bottom of each of the through holes 27. If residue remains at the bottoms of open portions after evaporating the insulative resin by use of the laser, the residue is removed by wet etching with sodium permanganate, ammonium persulfate or the like.

Figure 10D:
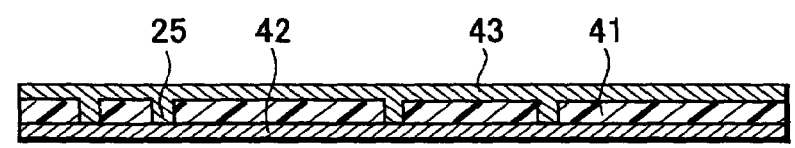

As shown in FIG. 10D, a plating film constituting the connecting portions 25 for electrically connecting the first conductive foil 42 to the second conductive foil 43 is formed on the entire surface of the second conductive foil 43 inclusive of the through holes 27. This plating film is formed in accordance with an electrolytic plating method, an electroless plating method, or a method combining electrolytic plating and electroless plating. The connecting portions 25 are formed by use of this plating film.

Figure 10E:
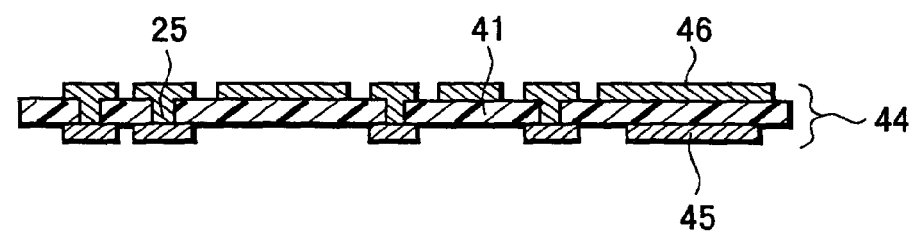

Next, as shown in FIG. 10E, first conductive pattern 45 and second conductive pattern 46 are formed by patterning the first conductive foil 42 and the second conductive foil 43. In this process, wiring sheet 44 is formed of the first conductive pattern 45, the second conductive pattern 46, and the insulating resin 41.

Figure 11A:
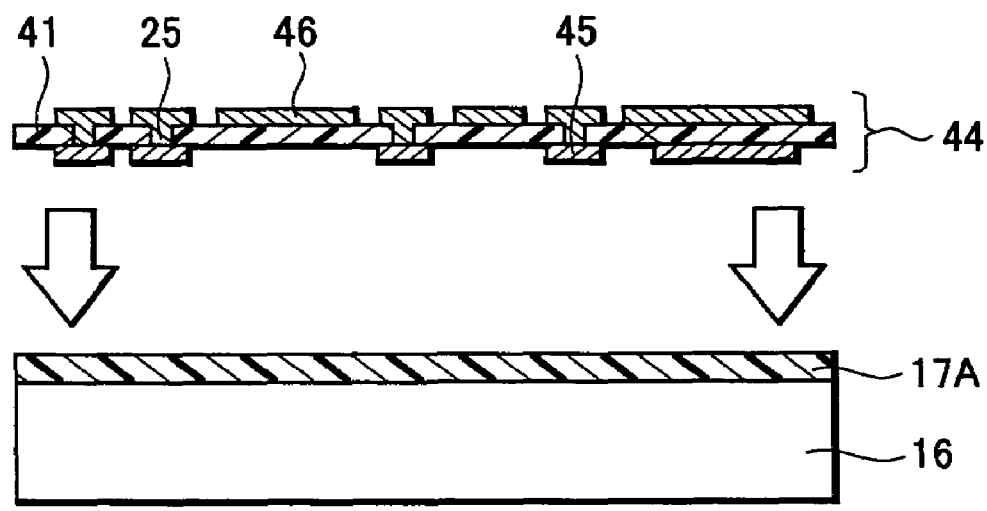
FIGS. 11A and 11B are cross-sectional views showing the method of manufacturing a hybrid integrated circuit device of the present invention.
Figure 11B:
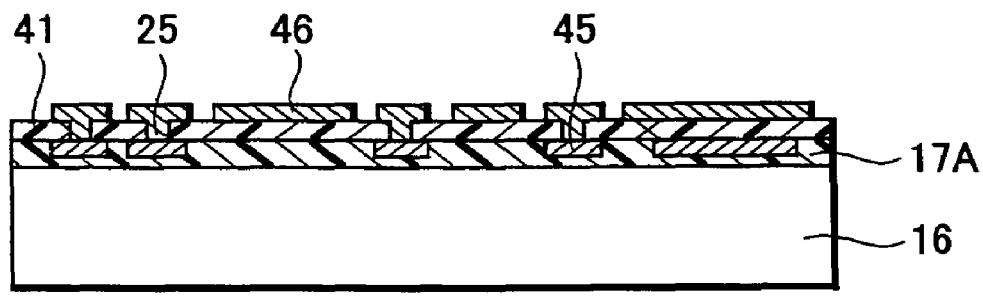

As shown in FIG. 11A and FIG. 11B, the wiring sheet 44 is crimped to the first insulating layer 17A formed on the surface of the circuit substrate 16. The filler is mixed in the first insulating layer 17A in light of the thermal conductivity. Here, a larger amount of the filler as compared to the filler included in the insulative resin 41 is mixed in the first insulating layer 17A. Alternatively, the filler having an average grain size greater than the filler included in the insulative resin 41 may be mixed therein. Then, the first conductive pattern 45 is buried in the first insulating layer 17A. It is possible to prevent occurrence of voids caused by air between the first conductive pattern 45 and the first insulation layer 17A by performing this adhesion process with a vacuum press. Moreover, side surfaces of the first conductive pattern 45 formed by isotropic etching are smoothly curved. Therefore, the resin enters along the curved surfaces when the first conductive pattern 45 is pressed into the first insulating layer 17A. Accordingly, voids are eliminated. In addition, as the first conductive pattern 45 is buried in the first insulating layer 17A, it is possible to enhance adhesion strength between the first conductive pattern 45 and the first insulating layer 17A.

Figure 12A:
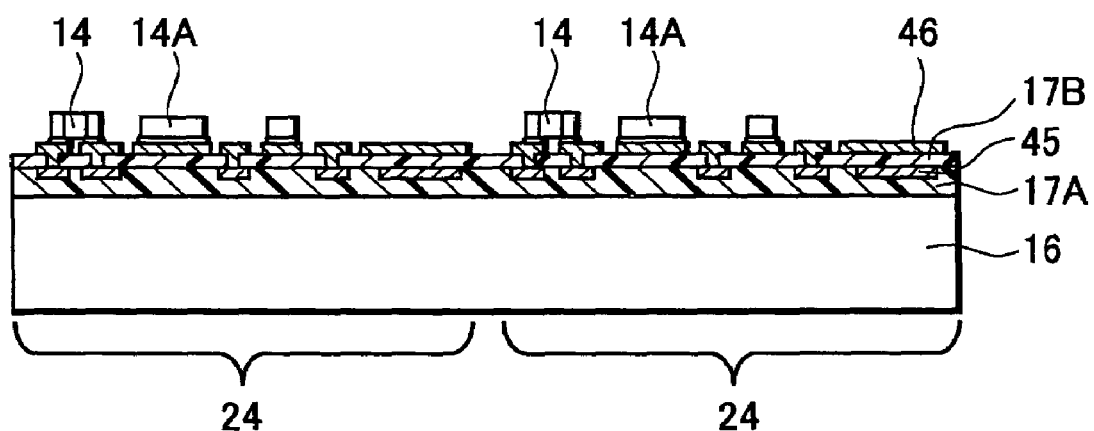
FIGS. 12A and 12B are cross-sectional views showing the method of manufacturing a hybrid integrated circuit device of the present invention.

As shown in FIG. 12A, circuit elements 14 are fixed to the second conductive pattern 46 (islands) by use of solder, a conductive paste or the like. Here, units 24 each constituting a hybrid integrated circuit device are formed on the single circuit substrate 16, and it is possible to subject the units 24 to die bonding and wire bonding in a lump. Here, active elements are mounted face up. However, the active elements can be mounted face down when appropriate.

Figure 12B:
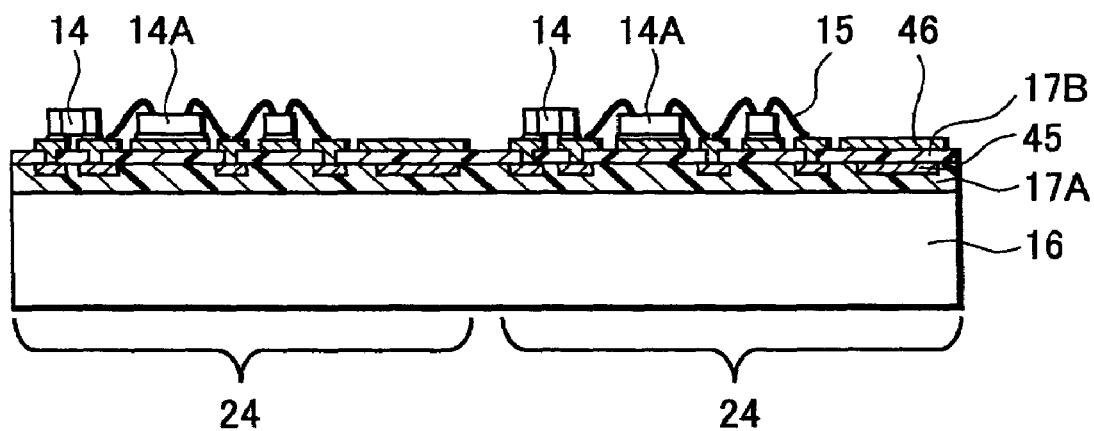

As shown in FIG. 12B, semiconductor elements 14A are electrically connected to the respective second conductive patterns 46 through metal thin wires 15.

The respective units 24 are separated after completing the above-described process. Separation of the respective units can be achieved by stamping out with a press machine, dicing, bending, or the like. Thereafter, leads 11 are fixed to the circuit substrate 16 of each of the units.

Figure 13:
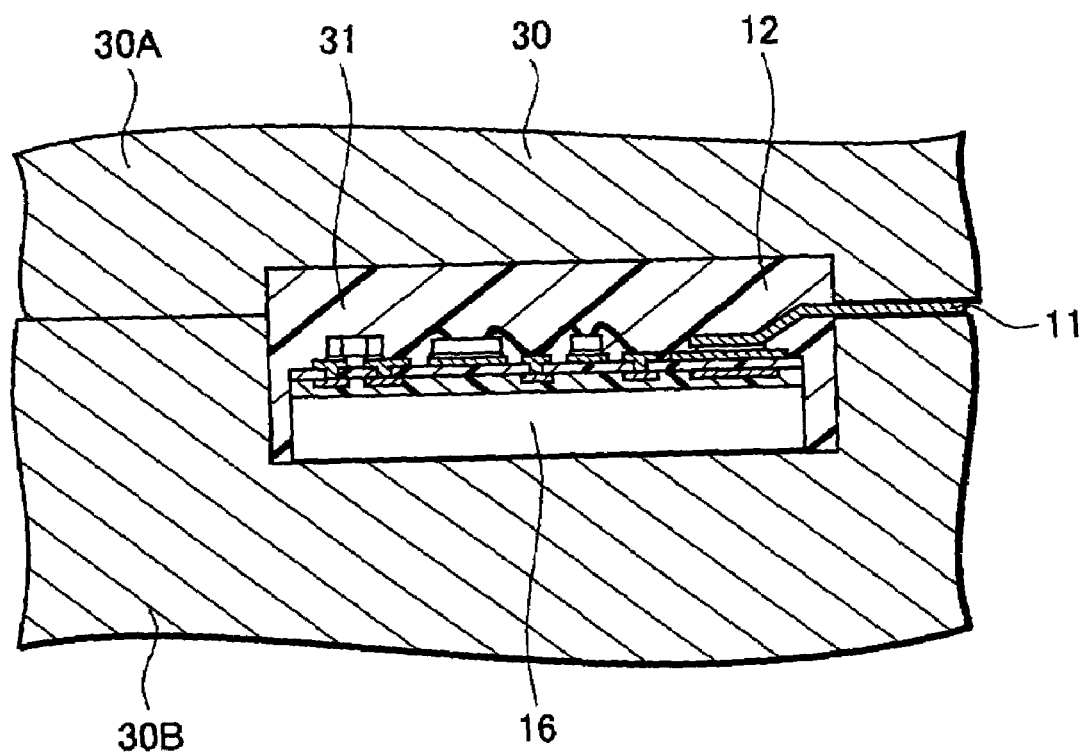
FIG. 13 is a cross-sectional view showing the method of manufacturing a hybrid integrated circuit device of the present invention.
Figure 14A:
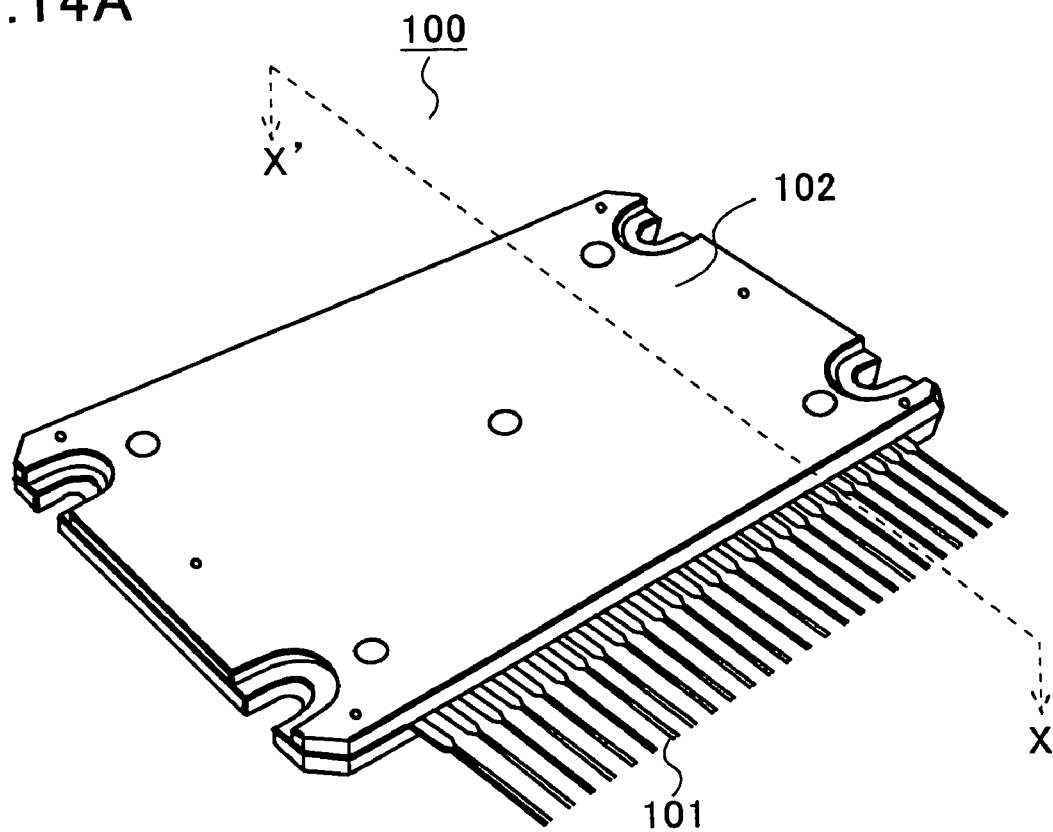
FIG. 14A is a perspective view and FIG. 14B is a cross-sectional view of a conventional hybrid integrated circuit device.
Figure 14B:
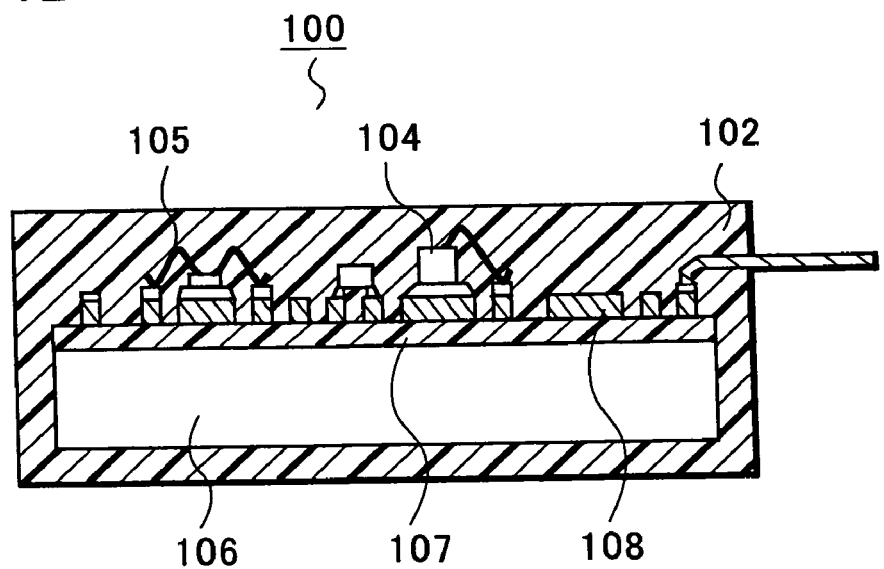

Each of the circuit substrates 16 is sealed with resin as shown in FIG. 13. Here, the circuit substrate 16 is sealed by transfer molding with thermosetting resin. Specifically, the circuit substrate 16 is housed in mold 30 including an upper mold 30A and an lower mold 30B, and then the leads 11 are fixed by engaging these molds together. Thereafter, the resin sealing process is achieved by filling the resin into a cavity 31. The integrated circuit device is manufactured by the above-described steps.

What is claimed is:

1. A circuit device comprising:
   a circuit substrate;
   a first insulating layer formed on a surface of the circuit substrate;
   a first conductive pattern formed on a surface of the first insulating layer;
   a second insulating layer covering the first conductive pattern;
   a second conductive pattern laminated above the first conductive pattern in a manner that the first and second conductive patterns are connected through the second insulating layer; and
   a connecting portion configured to penetrate a desired position of the second insulating layer and connect the first conductive pattern to the second conductive pattern,
   wherein each of the insulating layers includes filler,
   a larger amount of the filler is included in the first insulating layer than in the second insulating layer, and
   a grain size distribution of the filler included in the first insulating layer is wider than a grain size distribution of the filler included in the second insulating layer.

2. A circuit device comprising:
   a circuit substrate;
   a first insulating layer formed on a surface of the circuit substrate;
   a first conductive pattern formed on a surface of the first insulating layer;
   a second insulating layer covering the first conductive pattern;
   a second conductive pattern laminated above the first conductive pattern in a manner that the first and second conductive patterns are connected through the second insulating layer; and
   a connecting portion configured to penetrate a desired position of the second insulating layer and connect the first conductive pattern to the second conductive pattern,
   wherein each of the insulating layers includes filler,
   an average grain size of the filler included in the first insulating layer is greater than an average grain size of the filler included in the second insulating layer, and
   a grain size distribution of the filler included in the first insulating layer is wider than a grain size distribution of the filler included in the second insulating layer.

3. The circuit device according to any one of claims 1 and 2, wherein the first conductive pattern and the second conductive pattern intersect each other in a plane.

4. The circuit device according to any one of claims 1 and 2, wherein the circuit substrate is made of metal.

5. The circuit device according to any one of claims 1 and 2, further comprising:
   a circuit element to be electrically connected to the second conductive pattern.

6. The circuit device according to claim 5, wherein a thermal via hole for thermally connecting the second conductive pattern and the first conductive pattern is provided below a region to which the circuit element is fixed.

7. The circuit device according to claim 1 or 2 wherein the first conductive pattern is entirely covered by the second insulating layer except for the regions of the first conductive layer in contact with the connecting portion.

8. The circuit device according to claim 1 or 2 further comprising a high-power circuit element fixed directly on the first conductive pattern.

9. The circuit device according to claim 1 or 2 wherein the connecting portion comprises a first portion that protrudes continuously upward from the first conductive layer and contacts, in the middle of the second insulating layer, a second portion that protrudes continuously downward from the second conductive layer.

* * * * *